United States Patent [19]

Hagio et al.

[11] Patent Number: 4,782,031

[45] Date of Patent: Nov. 1, 1988

[54] METHOD OF MAKING GAAS MOSFET WITH LOW SOURCE RESISTANCE YET HAVING SATISFACTORY LEAKAGE CURRENT BY ION-IMPLANTATION

[75] Inventors: Masahiro Hagio, Kyoto; Shinichi Katsu, Takatsuki; Kazuhide Gohda, Nagaokakyo; Shutaro Nambu, Uji; Hiroshi Tsukada, Takatsuki, all of Japan

[73] Assignee: Matsushita Electronics Corporation, Kadoma, Japan

[21] Appl. No.: 22,597

[22] Filed: Mar. 4, 1987

Related U.S. Application Data

[62] Division of Ser. No. 662,042, Oct. 18, 1984, abandoned.

[30] Foreign Application Priority Data

Oct. 19, 1983 [JP] Japan .................. 58-194090

[51] Int. Cl.$^4$ ............ H01L 21/265; H01L 29/48
[52] U.S. Cl. .................. 437/039; 357/91; 437/22; 437/176; 437/912
[58] Field of Search ............ 437/22, 39, 176, 912; 357/91

[56] References Cited

U.S. PATENT DOCUMENTS

| | | | |
|---|---|---|---|
| 4,112,455 | 9/1978 | Seliger et al. | 437/22 |
| 4,119,995 | 10/1978 | Simko | 357/15 X |
| 4,277,882 | 7/1981 | Crossley | 357/15 X |
| 4,304,042 | 12/1981 | Yeh | 357/22 X |
| 4,377,030 | 3/1983 | Pettenpaul et al. | 29/576 B |
| 4,422,087 | 12/1983 | Ronen | 357/22 X |
| 4,503,599 | 3/1985 | Ueyanagi et al. | 437/22 |
| 4,540,446 | 9/1985 | Nonaka et al. | 437/22 |
| 4,559,238 | 12/1985 | Bujatti | 437/22 |

FOREIGN PATENT DOCUMENTS

| | | | |
|---|---|---|---|
| 0143075 | 11/1979 | Japan | 357/225 |
| 5414075 | 11/1979 | Japan . | |

OTHER PUBLICATIONS

Darley, H. M., and Houston, T. W., "Optimization of Self-Aligned Silicon MESFETS . . ." IEDM Technical Digest 12/80, pp. 34-37.
Codella et al., IBM-TDB, vol. 26, (1983), 1988.
Tiwari, IBM-TDB, 27 (1984), 1351.

*Primary Examiner*—Upendra Roy
*Attorney, Agent, or Firm*—Cushman, Darby & Cushman

[57] ABSTRACT

In an FET, two first semiconductor regions of higher impurity concentration and smaller thickness, for source electrode and drain electrode, are formed in a second semiconductor region of lower impurity concentration and larger thickness for a gate electrode, thereby obtaining a low source resistance and small leak current.

17 Claims, 4 Drawing Sheets

METHOD OF MAKING GAAS MOSFET WITH LOW SOURCE RESISTANCE YET HAVING SATISFACTORY LEAKAGE CURRENT BY ION-IMPLANTATION

This is a division of application Ser. No. 662,042, filed Oct. 18, 1984, abandoned.

BACKGROUND OF THE INVENTION

1. Field of the Invention

The present invention relates to a field effect transistor (FET) for use in a microwave band, etc. and a method of making the same.

2. Description of the Prior Art

It is necessary to make source resistance small, in order to obtain superior high-frequency characteristics with regard to a transistor for high-frequency, for example, a GaAs Schottky gate FET (abridged as a GaAs MESFET, hereafter). For example, the source resistance is designed usually not exceeding 5 Ω with regard to the GaAs MESFET for X band.

For the making the source resistance small, the source electrode and the gate electrode should be formed in a manner that both electrodes are disposed very closely to each other. Particularly, in the case where an active layer is considerably thin, for example, where an n-type active layer is formed by the ion-implanting method, the source resistance is extremely large when the distance between the source electrode and the gate electrode is large. Therefore, when the GaAs MESFET for the X band is produced to have the active layer formed with the ion-implanting method, the distance between the gate electrode and the source electrode, or a region having high impurity concentration in place of the source excede, should not be exceeding 1 μm.

However, for to a conventional production method, wherein the photolithographic process for forming the source electrode and the photolithographic process for forming the gate electrode are separately used by utilizing different masks, on account of error in mask alignment it is extremely difficult to obtain sizes under 1 μm as distances between the gate electrode and the source electrode or a region having high impurity concentration and serving in place of the source electrode Therefore, a so-called self-alignment method has been proposed recently. This method involves forming the gate electrode and the region having high impurity concentration and serving in place of the source electrode with one photolithographic process. FIGS. 1(a), 1(b) and 1(c) show one embodiment of such a self-alignment method. As shown in FIG. 1(a), after the gate electrode 13 is formed on an n-type region 12 disposed on a semi-insulating GaAs substrate 11, an n-type impurity is deeply ion-implanted. As shown in FIG. 1(b), a high concentration n-type region 14 is formed as a result of the ion-implantation only at such parts that are not covered by the gate electrode 13, since the gate electrode 13 has a masking function against the ion-implanting. Next as shown in FIG. 1(c), the source electrode 15 and the drain electrode 16 are formed on the high concentration n-type region 14. Therefore, the distance between the gate electrode 13 and the high concentration n-type region 14, to serve in place of the source electrode 15, becomes zero.

Such a conventional method, however, has the following practical disadvantages. That is, when the width of the gate electrode 13 is below 0.5 μm, a leak current $I_L$ flows as indicated by an arrow in FIG. 1(c), between the high concentration n-type region part of the source side and the high concentration n-type region part of the drain side through the semi-insulating GaAs substrate 11, since the high concentration n-type region 14 is thicker than the n-type region 12 and hence the semi-insulating GaAs substrate 11 does not perform complete insulation.

On account of the above-mentioned problems, hitherto it is difficult to produce a GaAs MESFET having superior high frequency characteristics.

SUMMARY OF THE INVENTION

The object of the present invention is to provide an FET in which a leak current between the source region and drain region is little and the source resistance is low, and to provide a method making of the same FET.

That is, a field effect transistor of the present invention comprises:
a semi-insulating substrate,
a first semiconductor region of one conductivity type formed on the semi-insulating substrate,
two second semiconductor regions of the above-mentioned one conductivity type, formed in the first semiconductor region, the impurity concentration of the second semiconductor regions being higher than that of the first semiconductor region and thickness of the second semiconductor region being smaller than that of the first semiconductor region,
a gate electrode formed on the first semiconductor region, at the part between the two second semiconductor regions,
the two seoond semiconductor regions forming a source region and a drain region, respectively.

In this FET, the source resistance is low and the leak current is satisfactorily low.

A further field effect transistor of the present invention comprises:
a semi-insulating substrate,
a first semiconductor region of one conductivity type formed on the semi-insulating substrate,
two second semiconductor regions of the one conductivity type, formed in the first semiconductor region, the impurity concentration of the second semiconductor region being higher than that of the first semiconductor region and the thickness of the second semiconductor region being smaller than that of the first semiconductor region,
a gate electrode formed on the part of the first semiconductor region, the part being separated from the second semiconductor regions,
the two second semiconductor regions forming a source region and a drain region, respectively.

In this FET, the source resistance is low and the leak current is satisfactorily low and the breakdown voltage of the gate electrode is high.

A further field effect transistor of the present invention comprises:
a semi-insulating substrate,
a first semiconductor region of one conductivity type formed on the semi-insulating substrate,
two second semiconductor regions of the one conductivity type, formed at both sides of the first semiconductor region, the impurity concentration of the second semiconductor region being higher than that of the first semiconductor region and the thickness of the second semiconductor region being larger than that of the first semiconductor region, two third semiconductor regions of the one conductivity type, formed in the first semiconductor region, the edges of the third semiconductor regions being in contact with the two second semicondutor regions, respectively the impurity concentration of the third semiconductor region being higher than that of the first semiconductor region and the thickness of the third semiconductor region being smaller than that of the first semiconductor region, a gate electrode formed on the first semiconductor region, a source electrode formed on the one second semiconductor region, a drain electrode formed on the other second semiconductor region.

In this FET, the source resistance is very low and the leak current is satisfactorily low.

The method of making a field effect transistor in accordance with the present invention comprises the steps of:

forming a semiconductor region of one conductivity type on a surface of a semi-insulating substrate, forming a thin film on selected part of the semiconductor region, the part corresponding to a position at which a gate electrode is to be formed, coating a thin layer selectively on the semiconductor region with covering the thin film, ion-implanting impurity of the one conductivity type into the whole semiconductor region from the above position of the thin layer, forming a source electrode and a drain electrode on the surface of the semiconductor region, the surface not being coated with the thin layer.

DESCRIPTION OF THE PREFERRED EMBODIMENTS

The embodiments of the present invention are described referring to the figures as follows.

Figure 2:
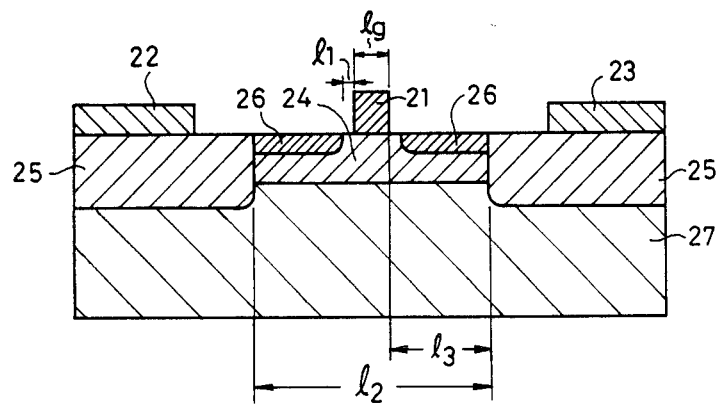
FIG. 2 is a sectional view showing an embodiment of an FET of the present invention.

FIG. 2 is a sectional view showing an embodiment of a GaAs MESFET in accordance with the present invention.

The GaAs MESFET of the present invention comprises a first n-type region 24, two second n-type regions 25, 25 on a semi-insulating GaAs substrate 27, two third n-type regions 26, 26 in the first n-type region 24, a gate electrode 21 on the first n-type region 24, a source electrode 22 on the one second n-type region 25 and a drain electrode 23 on the other second n-type region 25.

Figure 1A:
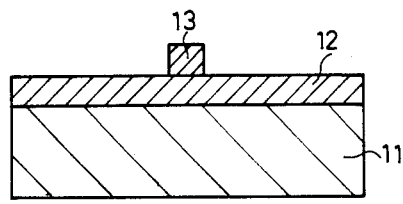
FIG. 1(a), FIG. 1(b) and FIG. 1(c) are sectional views showing a method of making a conventional GaAs MESFET, utilizing the ion-implanting method.
Figure 1B:
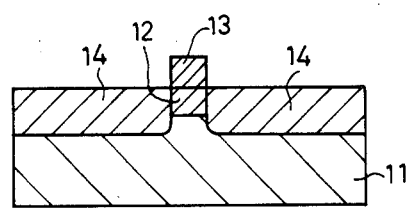
Figure 1C:
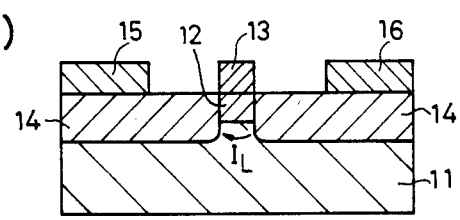

The first n-type region 24 forms a channel of the FET and is usually designed in a manner that the impurity concentration Nd is 0.5 to $5 \times 10^{17}$ cm$^{-3}$ and the thickness d is 0.05 to 0.4 μm. The second n-type region 25 has a larger thickness and higher impurity concentration than those of the first n-type region 24, so that the sheet resistance of the second n-type region and the contact resistance against the source electrode 22 and the drain electrode 23 are decreased. That is, the second n-type region 25 is usually designed in a manner that the impurity concentration Nd is higher than $1 \times 10^{18}$ cm$^{-3}$ and the thickness d is larger than 0.2 μm. The third n-type region 26 has smaller thickness and higher impurity concentration than those of the first n-type region 24, so that the resistance between the gate electrode 21 and the second n-type region 25 becomes low and the leak current $I_L$ indicated by the conventional embodiment of FIG. 1(c) is eliminated. That is, the third n-type region 26 is usually designed in a manner that the impurity concentration Nd is higher than $5 \times 10^{17}$ cm$^{-3}$ and the thickness d is 0.03 to 0.2 μm.

The shorter the distance $l_1$ between the third n-type region 26 and the gate electrode 21 becomes, the smaller the source resistance becomes, but the reverse breakdown voltage becomes low when the distance $l_1$ is too short. Therefore, it is necessary that the distance $l_1$ is not less than 0.05 μm.

In a GaAs FET used in the microwave band, the gate length lg is 0.3 to 1 μm and the distance $l_2$ between the second n-type region part of the source electrode side and the second n-type region part of the drain electrode side is 2 to 4 μm.

According to the above-mentioned constitution of the FET of the present invention, the GaAs MESFET having superior high frequehcy characteristics is obtainable, that is, the GaAs MESFET has sufficiently small source resistance as an FET for microwave uses and has a sufficient gate reverse breakdown voltage for practical use.

A method making of the FET of the present invention is described below referring to FIGS. 3(a)-3(e).

First, a gate electrode 33 is formed on an n-type region 31 which has been formed on a surface of a semi-insulating GaAs substrate 32. The n-type region 31 may be such n-type region which is not subject to a heat treatment for activation after an ion-implanting process. The forming method of the n-type region is not limited to the ion-implanting method, that is, vapor phase or liquid phase epitaxial growth method or molecular beam epitaxial growth can be available. The gate length lg is preferably 0.5 to 1 μm.

Figure 3A:
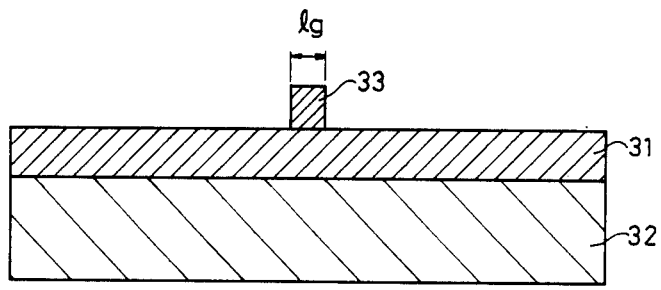
FIG. 3(a), FIG. 3(b), FIG. 3(c), FIG. 3(d) and FIG. 3(e) are sectional views showing an embodiment of a method of making an FET in accordance with the present invention.
Figure 3B:
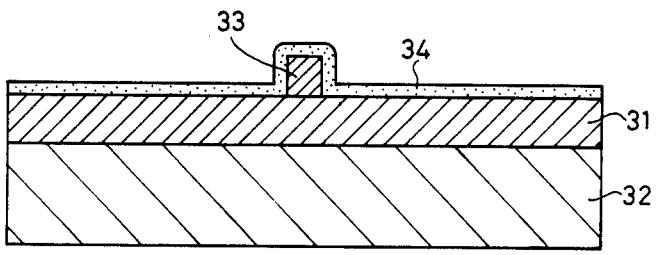

Next the whole surface of the material shown in FIG. 3(a) is coated with a thin layer 34, for instance, SiO$_2$ of about 0.1 μm as shown in FIG. 3(b).

Figure 3C:
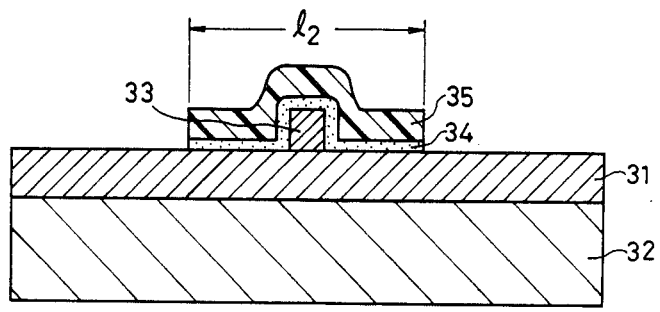

Then, a part of the thin layer 34, which is disposed on parts of the n-type regions 31, which are to become second n-type regions 36, 36, are selectively removed in a photolithographic etching process, as shown in FIG. 3(c), by using a pattern of photoresist 35, under which the thin layer 34 is retained unetched.

Figure 3D:
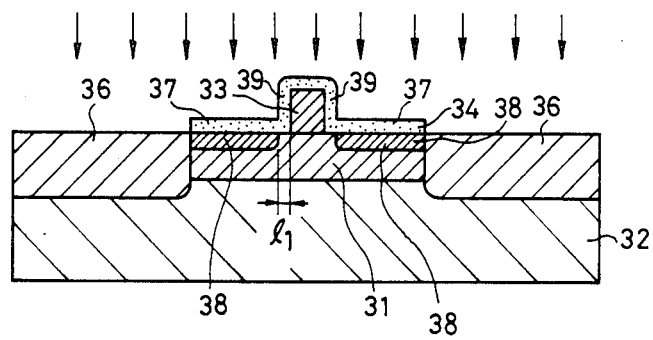

After removing the photoresist 35, an n-type impurity, for example, Si, S, Te or Sn is ion-implanted through the whole surface of the material shown in FIG. 3(c). As a result, as shown in FIG. 3(d), second n-type regions 36, 36 are formed on the substrate 32 at two positions of the first n-type region 31, where thin layer 34 has been removed by the etching method. At the same time, a third n-type region 38 is formed by ion-implanting with an n-type impurity on the substrate 32 at a position of the first n-type region 31, covered by the flat part 37 of the thin layer 34. The impurity concentration of the third n-type region 38 can be higher than that of the first n-type region 31 and the thickness of the third n-type region 38 can be smaller than that of the first n-type region 31 by adequately selecting the kind and thickness of the thin layer 37 as well as the acceleration voltage and the amount of the ion-implanting. A part 39 of the thin layer 34, which is attached to the side surface of the gate electrode 33 has considerable thickness in the direction of the ion-implanting as shown in FIG. 3(d). Therefore, the ion-implanted impurities do not reach the part of the first n-type region 31 existing directly under the thick part 39 of the thin layer 34. As a result, the gate electrode 33 and the third n-type region 38 are separated by distance $l_1$ frbm each other.

Figure 3E:
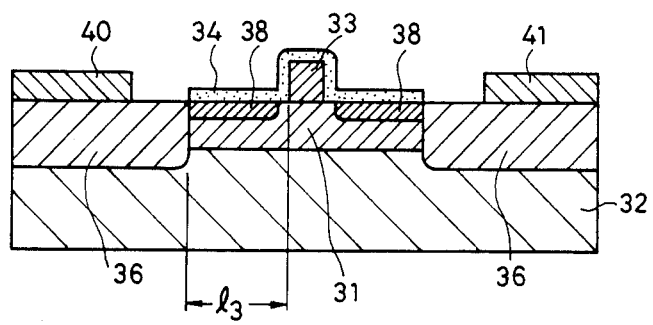

Next, heat treatments are executed for activating the ion-implanted impurity, and then the thin layer 34 is removed and the source electrode 40 and the drain electrode 41 are formed as shown in FIG. 3(e), thereby to produce the FET shown in FIG. 2.

The FET of the present invention is produced as above-mentioned. In the embodiment of the FET of the present invention, the source resistance can be made very small even though the distance $l_3$ between the gate electrode 33 and the second n-type region 36 is 1 to 2 μm, since the third n-type region 31 which is formed near the gate electrode 33, has the function to decrease the source resistance. Therefore, the distance $l_2$ between both second n-type regions 36, 36 can be as wide as 3 to 4 μm, whereby the mask registration in the photolithography in FIG. 3(c) is easy, and the production yield is high.

$SiO_2$ or $Si_3N_4$ is preferable for the raw material of the thin layer 34 and an organic matter, for example. Alternatively, photoresist can be used as the raw material of the thin layer 34. A normal pressure CVD method can be used for forming thin layer 34 of $SiO_2$ or $Si_3N_4$, but a plasma CVD method is more preferable for uniform forming of the part of the thin layer 34 attached to the side of the gate electrode 33 as well as the other part of the thin layer 34. The thickness of the thin layer 34 is determined by the ion-implanting conditions and the necessary reverse breakdown voltage, etc. Usually, the thickness is 0.05 to 0.8 μm.

Incidentally, in the above-mentioned embodiment, the metal material of the gate electrode 33 should be such metal as TiN or WSi which can form a Schottky junction and which can withstand any heat treatment, since the gate electrode 33 is formed before the heat treatment for activating the ion-implanting layer.

A second embodiment for obviating the above-mentioned disadvantage is described as follows.

In this second embodiment, a thin film 42 of $SiO_2$ or $Si_3N_4$ is used in place of the metal electrode of the gate electrode 33 until the heat treatment for activation. After the heat treatment for activation, the thin film 42 of $SiO_2$ or $Si_3N_4$ can be replaced with a metal of the gate electrode 33 as shown in FIGS. 4(a), FIG. 4(b), FIG. 4(c), FIG. 4(d) and FIG. 4(e).

Figure 4A:
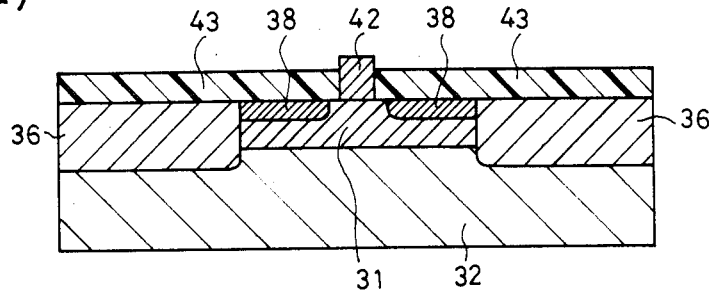
FIG. 4(a), FIG. 4(b), FIG. 4(c) and FIG. 4(d) are sectional views showing another embodiment of a method of making an FET in accordance with the present invention.
Figure 4B:
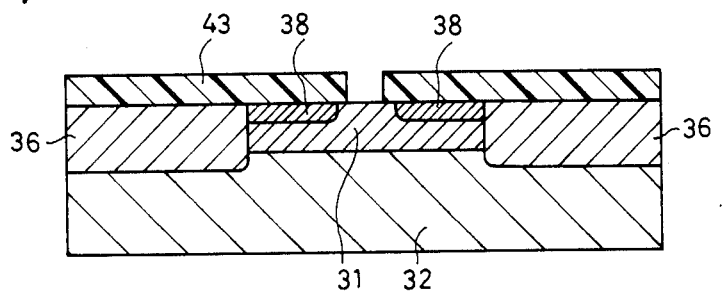
Figure 4C:
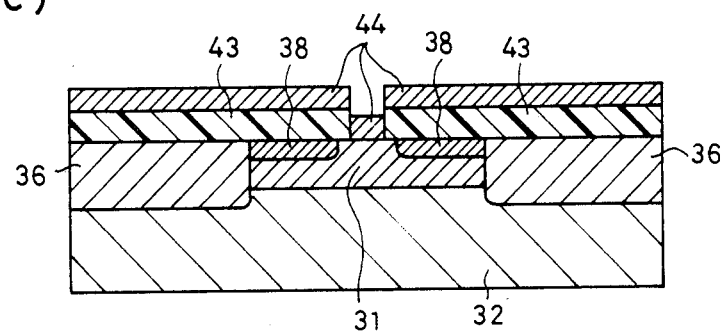
Figure 4D:
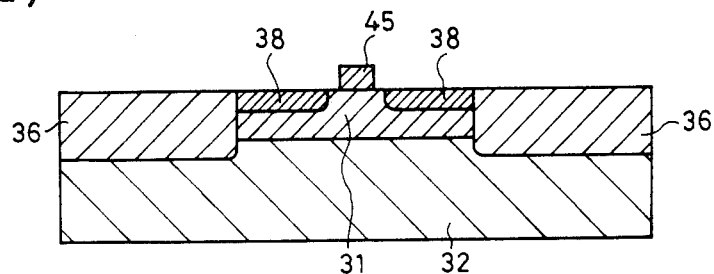

That is, a thin layer 43 of photoresist is filled up round the thin film 42 as shown in FIG. 4(a). Next, the thin film 42 is removed by etching method as shown in FIG. 4(b). Then, a metal 44 for a gate electrode is evaporated on the whole surface of the material of FIG. 4(b), as shown in FIG. 4(c). Thereafter, the gate electrode 45 is formed at the place where the thin film 42 existed, by removing both the thin layer 43 and the metal 44 on the thin layer 43 as shown in FIG. 4(d).

Figure 4E:
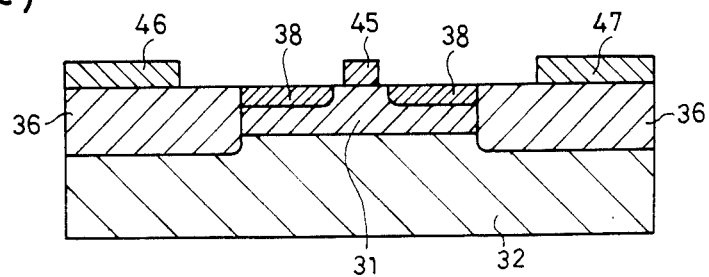

After the forming of the gate electrode 45, the source electrode 46 and the drain electrode 47 are formed as shown in FIG. 4(e).

In the second embodiment, it is not necessary that the metal of the gate electrode 45 is of a non-reactive Schottky metal. The metal can be Al, Ti/Al, Ti/Pt/Au which are usually used as Schottky metal.

In the above-mentioned embodiments, the third regions 26, 26 can be used as, a drain and a source.

Further, the gate electrode 21 and the third region 26 can contact to each other by shallow ion-implanting without the thin layer 34.

In place of the n-type conductivity materials used in the above-mentioned embodiments, p-type conductivity material can be used as the first region 24, the second region 25 and the third region 26.

As apparent from the above-mentioned, the FET of the present invention has the advantages that the source resistance is low and the leak current is small.

What is claimed is:

1. A method of making a field effect transistor comprising the steps of:
   forming a gate electrode on a surface of a first semiconductor region located on a semi-insulating surface;
   forming a thin film on said first semiconductor region, and on top and side surface of said gate electrode;
   selectively exposing said surface of said first semiconductor region by selectively removing said thin film disposed away from said side surfaces of said gate electrode at a fixed distance;
   ion-implanting an impurity of one conductivity type through said exposed surface of said first semiconductor region and through the unremoved thin film, thereby forming:
   (a) a pair of second semiconductor regions of said one conductivity type deeper than said first semiconductor region at a portion beneath said exposed surface of said first semiconductor region; and
   (b) a pair of third semiconductor regions of said one conductivity type thinner than said first semiconductor region at portions beneath said thin film except for the portion of said first semiconductor surface occupied by said gate electrode and said thin film formed on said side surfaces of said gate electrode; and
   forming a source electrode and drain electrode on said surface of said second semiconductor regions, respectively.

2. The method of claim 1, wherein said gate electrode is made of TiN or WSi.

3. The method of claim 1, wherein said thin film consists of $SiO_2$ or SiN made by using plasma CVD method.

4. The method of claim 1, wherein impurity concentration of said second and third semiconductor regions is higher than that of said first semiconductor region.

5. The method of claim 1, wherein said first semiconductor region is formed by epitaxial growth method.

6. The method of claim 1, wherein said first semiconductor region is formed by ion-implanting method.

7. The method of claim 1, wherein said semi-insulating substrate is semi-insulating GaAs substrate.

8. A method of making a field effect transistor comprising the steps of:
   forming a dummy gate on a surface of a first semiconductor region located on a semi-insulating substrate;
   forming a thin film on said first semiconductor region, and on top and side surfaces of said dummy gate;
   selectively exposing said surface of said first semiconductor region by selectively removing said thin film disposed away from said side surfaces of said dummy gate at a fixed distannce;
   ion-implanting impurity of one conductivity type through said exposed surface of said first semiconductor region and through the unremoved thin film, thereby forming:
   (a) a pair of second semiconductor regions of said one conductivity type deeper than said first semiconductor region at a portion beneath said exposed surface of said first semiconductor region; and
   (b) a pair of third semiconductor regions of said one conductivity type thinner than said first semiconductor region at portions beneath said thin film except for the portion of said first semiconductor surface occupied by said dummy gate and said thin film formed on said side surfaces of said dummy gate;
   removing siad thin film;
   forming a thin layer on said first, second and third
   removing said dummy gate to expose said surface of said first semiconductor region;
   forming a gate electrode on said exposed surface of said first semiconductor region;
   removing said thin layer; and
   forming a source electrode and a drain electrode on said surface of said second semiconductor regions, respectively.

9. The method of claim 8, wherein said dummy gate is made of SiO$_2$ or SiN.

10. The method of claim 8, wherein said thin layer is a photoresist layer.

11. The method of claim 8, wherein said gate electrode consists of TiN, WSi, Al, Ti/Al or Ti/Pt/Au.

12. The method of claim 8, wherein said thin film consists of SiO$_2$ or SiN made by using plasma CVD method.

13. The method of claim 8, wherein impurity concentration of said second and third semiconductor regions is higher than that of said first semiconductor region.

14. The method of claim 8, wherein said first semiconductor region is formed by epitaxial growth method.

15. The method of claim 8, wherein said first semiconductor region is formed by ion-implanting method.

16. The method of claim 8, wherein said semi-insulating substrate is semi-insulating GaAs substrate.

17. A method of making a GaAs Schottky gate field effect transistor comprising the steps of:
   forming a Schottky gate electrode on a surface of a first GaAs semiconductor region located on a semi-insulating GaAs substrate;
   forming a thin film on said first GaAs semiconductor region, and on top and side surfaces of said Schottky gate electrode;
   selectively exposing said surface of said first GaAs semiconductor region by selectively removing said thin film disposed away from said side surfaces of said Schottky gate electrode at a fixed distance;
   ion-implanting impurity of one conductivity type through said exposed surface of said first GaAs semiconductor region and through the unremoved thin film, thereby forming:
   (a) a pair of second GaAs semiconductor regions of said one conductivity type deeper than and having a higher impurity concentration than said first GaAs semiconductor region and at a portion beneath said exposed surface of said first GaAs semiconductor region;
   (b) a pair of third GaAs semiconductor regions of said one conductivity type thinner than and having a higher impurity concentration than said first GaAs semiconductor region and at portions beneath said thin film except for the portion of said first GaAs semiconductor surface occupied by said Schottky gate electrode and said thin film formed on said side surfaces of said Schottky gate electrode; and
   forming a source electrode and a drain electrode on said surface of sad second GaAs semiconductor regions, respectively.

* * * * *